(12) United States Patent
Tseng et al.

(10) Patent No.: US 8,350,340 B1
(45) Date of Patent: Jan. 8, 2013

(54) STRUCTURE OF OUTPUT STAGE

(75) Inventors: Wei-Kai Tseng, Tainan (TW);
Ming-Huang Lee, Tainan (TW);
Ying-Chuan Liu, Tainan (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 13/204,069

(22) Filed: Aug. 5, 2011

(51) Int. Cl.
*H01L 29/768* (2006.01)
(52) U.S. Cl. .................. 257/401; 257/386; 257/365
(58) Field of Classification Search .................. 257/365, 257/401, 386, 382
See application file for complete search history.

(56) References Cited

U.S. PATENT DOCUMENTS

| | | | |
|---|---|---|---|
| 8,120,119 B2 * | 2/2012 | Fischer et al. | 257/383 |
| 8,183,600 B2 * | 5/2012 | Shimizu | 257/207 |
| 8,217,464 B2 * | 7/2012 | Do et al. | 257/368 |

* cited by examiner

*Primary Examiner* — Michael Shingleton
(74) *Attorney, Agent, or Firm* — J.C. Patents

(57) ABSTRACT

A structure of an output stage includes a first electrode, a second electrode, a third electrode, multiple first auxiliary electrodes connected to the first electrode, multiple second auxiliary electrodes and multiple third auxiliary electrodes both connected to the second electrode, multiple fourth auxiliary electrodes connected to the third electrode, multiple first transistors and multiple second transistors. The widths of each the first auxiliary electrode and each the fourth auxiliary electrode are inversely proportional to the distance thereof respectively from the first electrode and the third electrode. The width of each of the second auxiliary electrodes and the third auxiliary electrodes is inversely proportional to the distance thereof from the second electrode. The first and second auxiliary electrodes are electrically connected to each other respectively through the turned-on first transistors. The third and fourth auxiliary electrodes are electrically connected to each other respectively through the turned-on second transistors.

11 Claims, 4 Drawing Sheets

STRUCTURE OF OUTPUT STAGE

BACKGROUND OF THE INVENTION

1. Field of the Invention

The invention generally relates to a structure of an output stage, and more particularly, to a structure of an output stage capable of advancing the driving capacity.

2. Description of Related Art

In recent years, since an operational amplifier has characteristic of high input impedance, high loop gain, low output impedance, low common mode gain and high gain bandwidth, the operational amplifier has been broadly applied in various circuits, for example, in the amplifier circuit for processing the amplification of large signals or in the driving circuit for driving such as capacitive load. In addition, an operational amplifier must have high driving capacity (i.e., high current output) for some large current applications (for example, applied in the driving circuit for driving a display panel).

In an operational amplifier with high driving capacity, the layout of the output stage thereof determines the value of the output current from the operational amplifier, so that the output stage of an operational amplifier occupies a significant position next to circuit design merely and it needs to pay specific attention on the design thereof. If the electrode layouts at the current terminal, ground terminal and output terminal thereof are not appropriate, an electron migration effect may occur, the electrodes may be burn-out, or the equivalent resistance between the electrodes is excessive so as to reduce the momentary maximum current provided by the output stage. When the operational amplifier is packaged as a chip, during the validation check, the output terminal of the operational amplifier would be short-circuit to the power terminal or the ground terminal. At the time, an over current protect (OCP) and an over temperature protect (OTP) are able to protect the operational amplifier for normal operation, but the situation may exist that sometimes the operational amplifier fails to pass validation check.

SUMMARY OF THE INVENTION

Accordingly, the invention is directed to a structure of an output stage capable of advancing the driving capacity of the output stage (i.e., the output current from the output stage).

The invention provides a structure of an output stage, the structure includes a first electrode, a second electrode, a third electrode, a plurality of first auxiliary electrodes, a plurality of second auxiliary electrodes, a plurality of third auxiliary electrodes, a plurality of fourth auxiliary electrodes, a plurality of first transistors and a plurality of second transistors. The first auxiliary electrodes are disposed between the first electrode and the second electrode and connected to the first electrode, in which the width of each of the first auxiliary electrodes is inversely proportional to the distance thereof from the first electrode. The second auxiliary electrodes are disposed between the first electrode and the second electrode and connected to the second electrode, in which the width of each of the second auxiliary electrodes is inversely proportional to the distance thereof from the second electrode. The third auxiliary electrodes are disposed between the second electrode and the third electrode and connected to the second electrode, in which the width of each of the third auxiliary electrodes is inversely proportional to the distance thereof from the second electrode. The fourth auxiliary electrodes are disposed between the second electrode and the third electrode and connected to the third electrode, in which the width of each of the fourth auxiliary electrodes is inversely proportional to the distance thereof from the third electrode. The first auxiliary electrodes and the second auxiliary electrodes are electrically connected to each other respectively through the turned-on first transistors. The third auxiliary electrodes and the fourth auxiliary electrodes are electrically connected to each other respectively through the turned-on second transistors.

In an embodiment of the above invention, the shapes of the first auxiliary electrodes, the second auxiliary electrodes, the third auxiliary electrodes and the fourth auxiliary electrodes are respectively a trapezoid.

In an embodiment of the above invention, the first electrode, the second electrode and the third electrode are sequentially disposed between a power terminal and a ground terminal.

In an embodiment of the above invention, the first electrode is electrically connected to the power terminal, the second electrode is electrically connected to an output terminal and the third electrode is electrically connected to the ground terminal.

In an embodiment of the above invention, each of the first auxiliary electrodes is electrically connected to one of the two adjacent second auxiliary electrodes through at least one of the turned-on first transistors.

In an embodiment of the above invention, each of the first auxiliary electrodes is electrically connected to the two adjacent second auxiliary electrodes through at least one of the turned-on first transistors.

In an embodiment of the above invention, each of the second auxiliary electrodes is electrically connected to the two adjacent first auxiliary electrodes through at least one of the turned-on first transistors.

In an embodiment of the above invention, each of the third auxiliary electrodes is electrically connected to one of the two adjacent fourth auxiliary electrodes through at least one of the turned-on second transistors.

In an embodiment of the above invention, each of the third auxiliary electrodes is electrically connected to the two adjacent fourth auxiliary electrodes through at least one of the turned-on second transistors.

In an embodiment of the above invention, each of the fourth auxiliary electrodes is electrically connected to the two adjacent third auxiliary electrodes through at least one of the turned-on second transistors.

In an embodiment of the above invention, the first transistors are respectively a PMOS-type transistor and the second transistors are respectively an NMOS-type transistor.

Based on the depiction above, in the structure of an output stage according to an embodiment of the invention, the first auxiliary electrodes of the output stage are connected to the first electrode and the width of each of the first auxiliary electrodes is inversely proportional to the distance thereof from the first electrode; the second auxiliary electrodes of the output stage are connected to the second electrode and the width of each of the second auxiliary electrodes is inversely proportional to the distance thereof from the second electrode; the third auxiliary electrodes are connected to the second electrode and the width of each of the third auxiliary electrodes is inversely proportional to the distance thereof from the second electrode; the fourth auxiliary electrodes are connected to the third electrode and the width of each of the fourth auxiliary electrodes is inversely proportional to the distance thereof from the third electrode. In this way, the values of the currents flowing through the first auxiliary electrodes, the second auxiliary electrodes, the third auxiliary electrodes and the fourth auxiliary electrodes can be increased.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
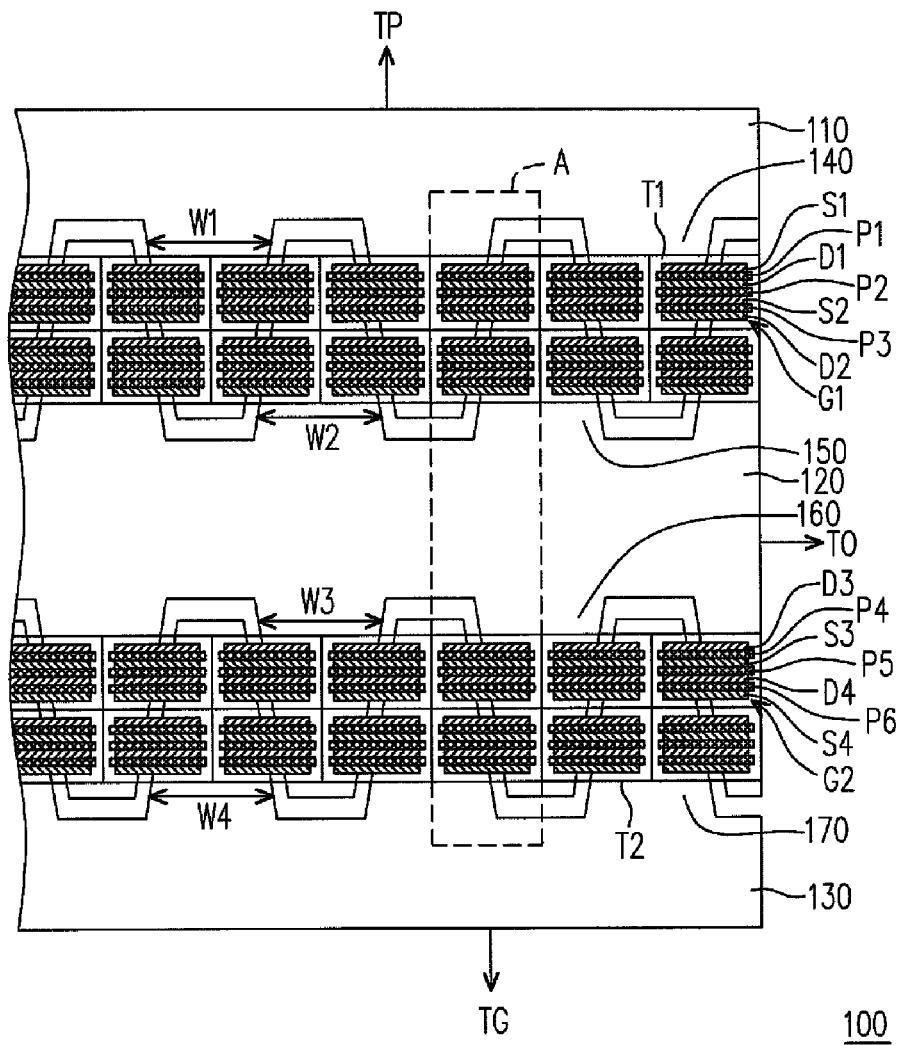
FIG. 1A is a schematic diagram of a structure of an output stage according to an embodiment of the invention.

FIG. 1A is a schematic diagram of a structure of an output stage according to an embodiment of the invention. Referring to FIG. 1A, in the embodiment, an output stage 100 includes a first electrode 110, a second electrode 120, a third electrode 130, a plurality of first auxiliary electrodes 140, a plurality of second auxiliary electrodes 150, a plurality of third auxiliary electrodes 160, a plurality of fourth auxiliary electrodes 170, a plurality of first transistors T1 and a plurality of second transistors T2. The first electrode 110, the second electrode 120 and the third electrode 130 herein are sequentially in parallel disposed between a power terminal TP and a ground terminal TG, the first electrode 110 is electrically connected to the power terminal TP, the second electrode 120 is electrically connected to an output terminal TO and the third electrode 130 is electrically connected to the ground terminal TG, in which the power terminal TP, the output terminal TO and the ground terminal TG can be a power terminal, an output terminal and a ground terminal of a chip. In addition, in the embodiment, the first transistor T1 can be a PMOS-type transistor and the second transistor T2 can be an NMOS-type transistor, which the invention is not limited to.

The first auxiliary electrodes 140 and the second auxiliary electrodes 150 are disposed between the first electrode 110 and the second electrode 120, the first auxiliary electrodes 140 are connected to the first electrode 110, the second auxiliary electrodes 150 are connected to the second electrode 120 and the first auxiliary electrodes 140 are indirectly connected to the second auxiliary electrodes 150. Herein, the width W1 of each of the first auxiliary electrodes 140 is inversely proportional to the distance thereof from the first electrode 110, i.e., the closer to the first electrode 110, the wider the width W1 of each of the first auxiliary electrodes 140 is and the farther to the first electrode 110, the narrower the width W1 of each of the first auxiliary electrodes 140 is; the width W2 of each of the second auxiliary electrodes 150 is inversely proportional to the distance thereof from the second electrode 120, i.e., the closer to the second electrode 120, the wider the width W2 of each of the second auxiliary electrodes 150 is and the farther to the second electrode 120, the narrower the width W2 of each of the second auxiliary electrodes 150 is. In the embodiment, the shapes of the first auxiliary electrodes 140 and the second auxiliary electrodes 150 are in trapezoid, which the other embodiments of the invention are not limited to.

The third auxiliary electrodes 160 and the fourth auxiliary electrodes 170 are disposed between the second electrode 120 and the third electrode 130, the third auxiliary electrodes 160 are connected to the second electrode 120, the fourth auxiliary electrodes 170 are connected to the third electrode 130 and the third auxiliary electrodes 160 are indirectly connected to the fourth auxiliary electrodes 170. Herein, the width W3 of each of the third auxiliary electrodes 160 is inversely proportional to the distance thereof from the second electrode 120, i.e., the closer to the second electrode 120, the wider the width W3 of each of the third auxiliary electrodes 160 is and the farther to the second electrode 120, the narrower the width W3 of each of the third auxiliary electrodes 160 is; the width W4 of each of the fourth auxiliary electrodes 170 is inversely proportional to the distance thereof from the third electrode 130, i.e., the closer to the third electrode 130, the wider the width W4 of each of the fourth auxiliary electrodes 170 is and the farther to the third electrode 130, the narrower the width W4 of each of the fourth auxiliary electrodes 170 is. In the embodiment, the shapes of the third auxiliary electrodes 160 and the fourth auxiliary electrodes 170 are in trapezoid, which the other embodiments of the invention are not limited to.

In the embodiment, the first transistors T1 are drawn in two rows, and the first auxiliary electrodes 140 and the second auxiliary electrodes 150 are electrically connected to each other respectively through the turned-on first transistors T1, i.e., each of the first auxiliary electrodes 140 is electrically connected to the corresponding second auxiliary electrode 150 at an adjacent side thereof through the two turned-on first transistors T1 and electrically connected to the corresponding second auxiliary electrode 150 at another adjacent side thereof through the other two turned-on first transistors T1. In other embodiments, the first transistors T1 can be designed in one row or multiple rows depending on the design of the circuit structure. When the first transistors T1 are arranged in one row, each of the first auxiliary electrodes 140 is electrically connected to the corresponding second auxiliary electrode 150 at an adjacent side thereof through one turned-on first transistor T1 and electrically connected to the corresponding second auxiliary electrode 150 at another adjacent side thereof through the other one turned-on first transistors T1.

In the embodiment, the second transistors T2 are in the same way drawn in two rows, and the third auxiliary electrodes 160 and the fourth auxiliary electrodes 170 are electrically connected to each other respectively through the turned-on second transistors T2, i.e., each of the third auxiliary electrodes 160 is electrically connected to the corresponding fourth auxiliary electrode 170 at the left adjacent side thereof through two turned-on second transistors T2 and electrically connected to the corresponding fourth auxiliary electrode 170 at the right adjacent side thereof through the other two turned-on second transistors T2. In other embodiments, the second transistors T2 can be designed in one row or multiple rows depending on the design of the circuit structure. When the second transistors T2 are arranged in one row, each of the third auxiliary electrodes 160 is electrically connected to the corresponding fourth auxiliary electrode 170 at an adjacent side thereof through one turned-on first transistor T2 and electrically connected to the corresponding fourth auxiliary electrode 170 at another adjacent side thereof through the other one turned-on second transistors T2.

According to the described above, when the first transistors T1 are turned on, the first transistors T1 would transmit the currents flowing into the first auxiliary electrodes 140 to the second auxiliary electrodes 150. At the time, the current density of the first auxiliary electrodes 140 is higher at the place close to the first electrode 110 and is gradually reduced at the places far away from the first electrode 110. As a result, the closer to the first electrode 110, the wider the width W1 is and the farther to the first electrode 110, the narrower the width W1 is so as to avoid the equivalent resistances of the first auxiliary electrodes 140 from being excessive and to increase the maximum currents flowing through the first auxiliary electrodes 140. Meanwhile, the current density of the second auxiliary electrodes 150 is higher at the place close to the second electrode 120 and is gradually reduced at the places far away from the second electrode 120. As a result, the closer to the second electrode 120, the wider the width W2 is and the farther to the second electrode 120, the narrower the width W2 is so as to avoid the equivalent resistances of the second auxiliary electrodes 150 from being excessive and to increase the maximum currents flowing through the second auxiliary electrodes 150.

In the embodiment, in the same way, the closer to the second electrode 120, the wider the width W3 is and the farther to the second electrode 120, the narrower the width W3 is and the closer to the third electrode 130, the wider the width W4 is and the farther to the third electrode 130, the narrower the width W4 is, where the design principle is similar to the above-mentioned first auxiliary electrodes 140 and second auxiliary electrodes 150 and they are omitted for simplicity. In this way, the equivalent resistances of the third auxiliary electrodes 160 and the fourth auxiliary electrodes 170 are avoided from being excessive and the maximum currents flowing through the third auxiliary electrodes 160 and the fourth auxiliary electrodes 170 are increased.

In more details, in the embodiment, each of the first transistors T1 includes two sources S1 and S2, two drains D1 and D2, three channel layers P1-P3 and a gate G1, in which the sources 51 and S2, the drains D1 and D2 and the channel layers P1-P3 are explanatorily in bar shapes, which the other embodiments of the invention are not limited to. The channel layers P1-P3 are disposed between the sources S1 and S2 and the drains D1 and D2, and assuming that herein the sources S1 and S2 are electrically connected to the corresponding first auxiliary electrodes 140 and the drains D1 and D2 are electrically connected to the corresponding second auxiliary electrodes 150. When the channel layers P1-P3 create channels affected by the voltage of the gate G1, the drain D1 would be electrically connected to the sources S1 and S2 through the channel layers P1 and P2 and the drain D2 would be electrically connected to the source S2 through the channel layer P3.

In the embodiment, each of the second transistors T2 includes two sources S3 and S4, two drains D3 and D4, three channel layers P4-P6 and a gate G2, in which the sources S3 and S4, the drains D3 and D4 and the channel layers P4-P6 are explanatorily in bar shapes, which the other embodiments of the invention are not limited to. The channel layers P4-P6 are disposed between the sources S3 and S4 and the drains D3 and D4, and assuming that herein the sources S3 and S4 are electrically connected to the corresponding fourth auxiliary electrodes 170 and the drains D3 and D4 are electrically connected to the corresponding third auxiliary electrodes 160. When the channel layers P4-P6 create channels affected by the voltage of the gate G2, the source S3 would be electrically connected to the drains D3 and D4 through the channel layers P4 and P5 and the source S4 would be electrically connected to the drain D4 through the channel layer P6.

Figure 1B:
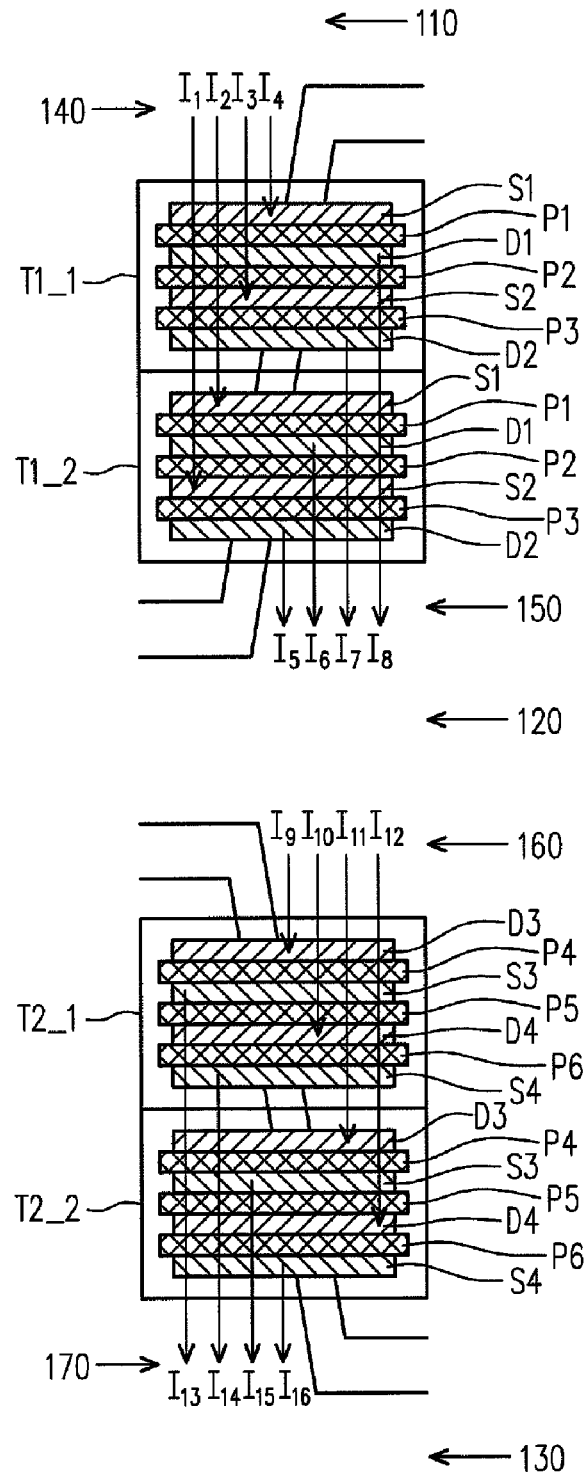
FIG. 1B is an enlarged schematic diagram of the A-portion in the structure of FIG. 1A.

FIG. 1B is an enlarged schematic diagram of the A-portion in the structure of FIG. 1A. Referring to FIGS. 1A and 1B, in the embodiment, the depiction is following a sequence from up to down, in which "prior to" means the upper location in figures and "after" means the lower location in the figures, which the invention is not limited to. Prior to the source S1 of the first transistors T1_1, the current flowing through the first auxiliary electrode 140 is roughly $I_1+I_2+I_3+I_4$, in which the current $I_1$ is the current flowing into the source S2 of the first transistors T1_2, the current $I_2$ is the current flowing into the source S1 of the first transistors T1_2, the current $I_3$ is the current flowing into the source S2 of the first transistors T1_1 and the current $I_4$ is the current flowing into the source S1 of the first transistors T1_1.

The current flowing through the first auxiliary electrode 140 between the sources S1 and S2 of the first transistors T1_1 is roughly $I_1+I_2+I_3$; the current flowing through the first auxiliary electrode 140 between the sources S2 of the first transistor T1_1 and the source S1 of the first transistors T1_2 is roughly $I_1+I_2$; the current flowing through the first auxiliary electrode 140 between the sources S1 and S2 of the first transistors T1_2 is roughly $I_1$. After the source S2 of the first transistor T1_2, the current flowing through the first auxiliary electrode 140 is roughly zero. As a result, the closer to the first electrode 110, the higher the current density of the first auxiliary electrode 140 is, and the farther from the first electrode 110, the lower the current density of the first auxiliary electrode 140 is.

Prior to the drain D1 of the first transistor T1_1, the current flowing through the second auxiliary electrode 150 is roughly zero. The current flowing through the second auxiliary electrode 150 between the drains D1 and D2 of the first transistor T1_1 is roughly $I_8$, in which the current $I_8$ is the current flowing out from the drain D1 of the first transistors T1_1. The current flowing through the second auxiliary electrode 150 between the drain D2 of the first transistor T1_1 and the drain D1 of the first transistor T1_2 is roughly $I_7+I_8$, in which the current $I_7$ is the current flowing out from the drain D2 of the first transistors T1_1.

The current flowing through the second auxiliary electrode 150 between the drains D1 and D2 of the first transistor T1_2 is roughly $I_6+I_7+I_8$, in which the current $I_6$ is the current flowing out from the drain D1 of the first transistors T1_2. After the drain D2 of the first transistor T1_2, the current flowing through the second auxiliary electrode 150 is roughly $I_5+I_6+I_7+I_8$, in which the current $I_5$ is the current flowing out from the drain D2 of the first transistors T1_2. As a result, the closer to the second electrode 120, the higher the current density of the second auxiliary electrode 150 is, and the farther from the second electrode 120, the lower the current density of the second auxiliary electrode 150 is.

Prior to the drain D3 of the second transistor T2_1, the current flowing through the third auxiliary electrode 160 is roughly $I_9+I_{10}+I_{11}+I_{12}$, in which the current $I_9$ is the current flowing into the drain D3 of the second transistors T2_1, the current $I_{10}$ is the current flowing into the drain D4 of the second transistors T2_1, the current $I_{11}$ is the current flowing into the drain D3 of the second transistors T2_2, and the current $I_{12}$ is the current flowing into the drain D4 of the second transistors T2_2. The current flowing through the third auxiliary electrode 160 between the drains D3 and D4 of the second transistor T2_1 is roughly $I_{10}+I_{11}+I_{12}$.

The current flowing through the third auxiliary electrode 160 between the drain D4 of the second transistor T2_1 and the drain D3 of the second transistor T2_2 is roughly $I_{11}+I_{12}$. The current flowing through the third auxiliary electrode 160 between the drains D3 and D4 of the second transistor T2_2 is roughly $I_{12}$. After the drain D4 of the second transistor T2_2, the current flowing through the third auxiliary electrode 160 is roughly zero. As a result, the closer to the second electrode 120, the higher the current density of the third auxiliary electrode 160 is, and the farther from the second electrode 120, the lower the current density of the third auxiliary electrode 160 is.

Prior to the source S3 of the second transistor T2_1, the current flowing through the fourth auxiliary electrode 170 is roughly zero. The current flowing through the fourth auxiliary electrode 170 between the sources S3 and S4 of the second transistor T2_1 is roughly $I_{13}$, in which the current $I_{13}$ is the current flowing out from the source S3 of the second transistors T2_1. The current flowing through the fourth auxiliary electrode 170 between the source S4 of the second transistor T2_1 and the source S3 of the second transistor T2_2 is roughly $I_{13}+I_{14}$, in which the current $I_{14}$ is the current flowing out from the source S4 of the second transistors T2_1.

The current flowing through the fourth auxiliary electrode 170 between the sources S3 and S4 of the second transistor T2_2 is roughly $I_{13}+I_{14}+I_{15}$, in which the current $I_{15}$ is the current flowing out from the source S3 of the second transistors T2_2. After the source S4 of the second transistor T2_2, the current flowing through the fourth auxiliary electrode 170 is roughly $I_{13}+I_{14}+I_{15}+I_{16}$, in which the current $I_{16}$ is the current flowing out from the source S4 of the second transistors T2_2. As a result, the closer to the third electrode 130, the higher the current density of the fourth auxiliary electrode 170 is, and the farther from the third electrode 170, the lower the current density of the fourth auxiliary electrode 170 is.

Figure 2:
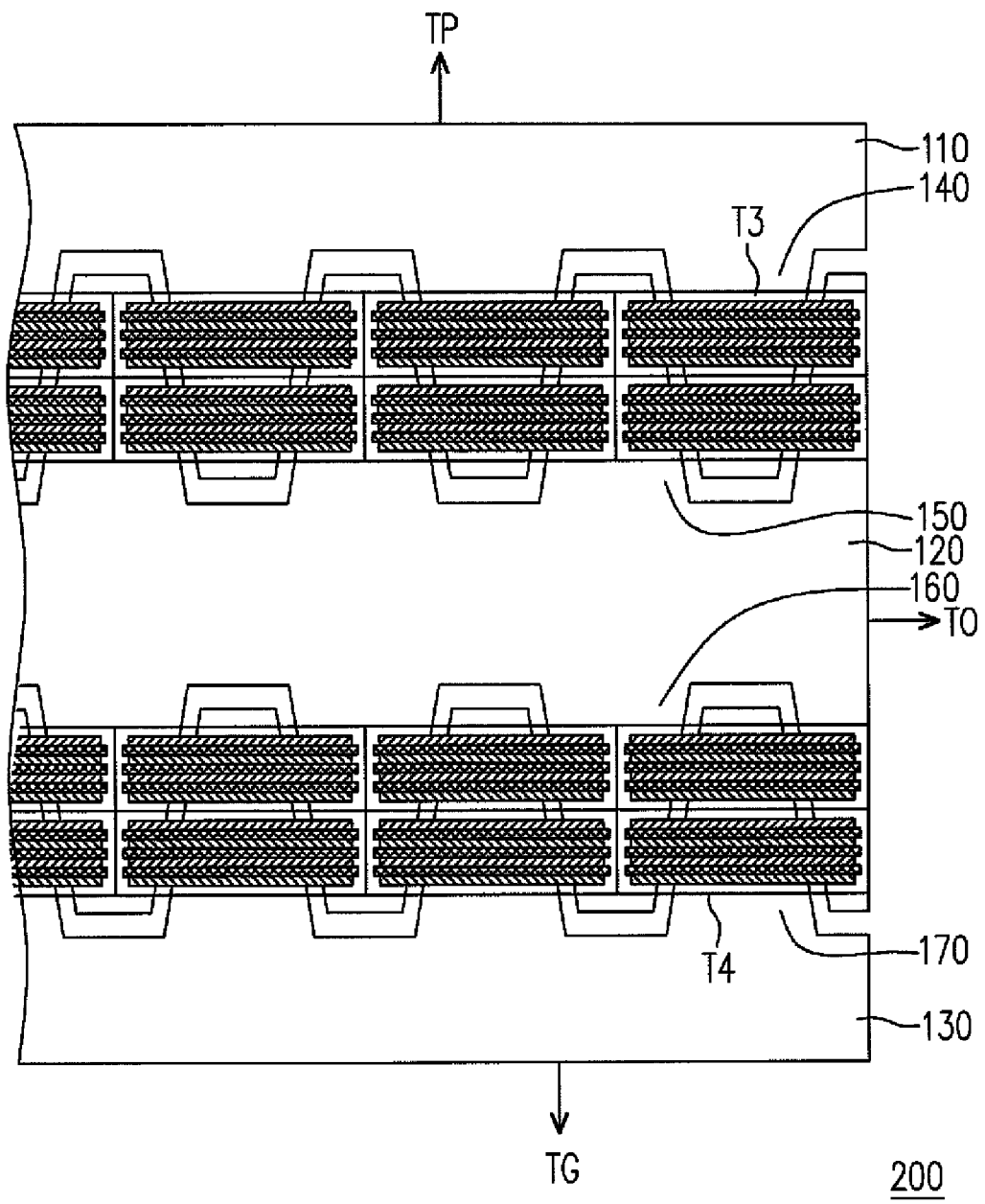
FIG. 2 is a schematic diagram of a structure of an output stage according to another embodiment of the invention.

FIG. 2 is a schematic diagram of a structure of an output stage according to another embodiment of the invention. Referring to FIGS. 1A and 2, the structure of FIG. 2 is similar to the structure of FIG. 1A except for the first transistors T3 and the second transistors T4, in which the operations of the first transistors T3 are similar to that of the first transistors T1 and the operations of the second transistors T4 are similar to that of the second transistors T2. In the embodiment, each of the first transistors T3 of the output stage 200 is across the corresponding first auxiliary electrode 140 and is partially overlapped with two second auxiliary electrodes 150 adjacent to the corresponding first auxiliary electrode 140. At the time, each of the first auxiliary electrodes 140 can be electrically connected to the two adjacent second auxiliary electrodes 150 through two turned-on first transistors T3.

Each of the second transistors T4 is across the corresponding third auxiliary electrode 160 and is partially overlapped with two fourth auxiliary electrodes 170 adjacent to the corresponding third auxiliary electrode 160. As a result, each of the third auxiliary electrodes 160 can be electrically connected to the two adjacent fourth auxiliary electrodes 170 through two turned-on second transistors T4. In this way, since the current of the first auxiliary electrode 140 can flow to the two adjacent second auxiliary electrodes 150 through the turned-on first transistor T3 and the current of the third auxiliary electrode 160 can flow to the two adjacent fourth auxiliary electrodes 170 through the turned-on second transistor T4, so that the flowing value of the current can be increased.

Additionally in other embodiments, each of the first transistors T3 can be across the corresponding second auxiliary electrode 150 and partially overlapped with two first auxiliary electrodes 140 adjacent to the corresponding second auxiliary electrode 150 to make each of the second auxiliary electrodes 150 electrically connected to the two adjacent first auxiliary electrodes 140 through two turned-on first transistors T3. Each of the second transistors T4 can be across the corresponding fourth auxiliary electrode 170 and partially overlapped with two third auxiliary electrodes 160 adjacent to the corresponding fourth auxiliary electrode 170 to make each of the fourth auxiliary electrodes 170 electrically connected to the two adjacent third auxiliary electrodes 160 through two turned-on second transistors T4.

Figure 3:
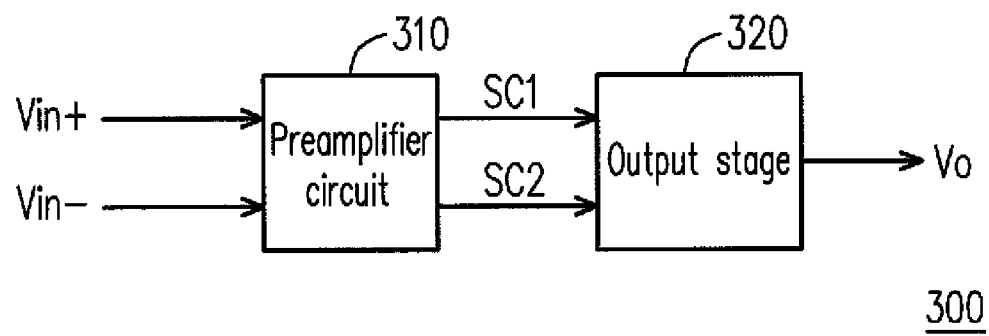
FIG. 3 is a system block chart of an operational amplifier according to an embodiment of the invention.

FIG. 3 is a system block chart of an operational amplifier according to an embodiment of the invention. Referring to FIG. 3, in the embodiment, an operational amplifier 300 includes a preamplifier circuit 310 and an output stage 320, in which the output stage 320 can be implemented by using the above-mentioned output stage 100 or 200. The preamplifier circuit 310 receives an input voltage Vin+ at the positive terminal and an input voltage Vin− at the negative terminal and thereby produces two control signals SC1 and SC2. The control signal SC1 herein is, for example, for controlling the first transistors (for example, T1 or T3) in the output stage 320 to be turned on or off, and the control signal SC2 herein is for, for example, controlling the second transistors (for example, T2 or T4) in the output stage 320 to be turned on or off. In this way, the desired output voltage Vo from the output stage 320 can be controlled.

In addition, the output stage 100 or 200 of the above-mentioned embodiments can also be applied to a pulse-width modulator or a power switch, the unique point thereof from the above-mentioned application in an operational amplifier rests in that the pre-stage circuit of the output stage 100 and 200 is a pulse-width modulation control circuit or a switch control circuit, in which the pulse-width modulation control circuit or the switch control circuit in the same way produce the control signals SC1 and SC2 to control the output voltage Vo from the output stage 100 or 200.

In summary, in he output stage of the embodiments of the invention, the width variations of the auxiliary electrodes can be set according to the current density distributions of the auxiliary electrodes, so that the currents flowing through the auxiliary electrodes get maximized. In addition, each of the transistors can be across the corresponding auxiliary electrodes and partially overlapped with two adjacent auxiliary electrodes so as to increase the flowing value of the currents.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive.

What is claimed is:

1. A structure of an output stage, comprising:
   a first electrode;
   a second electrode;
   a third electrode;
   a plurality of first auxiliary electrodes, disposed between the first electrode and the second electrode and connected to the first electrode, wherein a width of each of the first auxiliary electrodes is inversely proportional to a distance thereof from the first electrode;
   a plurality of second auxiliary electrodes, disposed between the first electrode and the second electrode and connected to the second electrode, wherein a width of each of the second auxiliary electrodes is inversely proportional to a distance thereof from the second electrode;
   a plurality of third auxiliary electrodes, disposed between the second electrode and the third electrode and connected to the second electrode, wherein a width of each of the third auxiliary electrodes is inversely proportional to a distance thereof from the second electrode;

a plurality of fourth auxiliary electrodes, disposed between the second electrode and the third electrode and connected to the third electrode, wherein a width of each of the fourth auxiliary electrodes is inversely proportional to a distance thereof from the third electrode;

a plurality of first transistors, wherein the first auxiliary electrodes and the second auxiliary electrodes are electrically connected to each other respectively through the turned-on first transistors; and a plurality of second transistors, wherein the third auxiliary electrodes and the fourth auxiliary electrodes are electrically connected to each other respectively through the turned-on second transistors.

2. The structure of an output stage as claimed in claim 1, wherein the shapes of the first auxiliary electrodes, the second auxiliary electrodes, the third auxiliary electrodes and the fourth auxiliary electrodes are respectively a trapezoid.

3. The structure of an output stage as claimed in claim 1, wherein the first electrode, the second electrode and the third electrode are sequentially disposed between a power terminal and a ground terminal.

4. The structure of an output stage as claimed in claim 3, wherein the first electrode is electrically connected to the power terminal, the second electrode is electrically connected to an output terminal and the third electrode is electrically connected to the ground terminal.

5. The structure of an output stage as claimed in claim 1, wherein each of the first auxiliary electrodes is electrically connected to one of the two adjacent second auxiliary electrodes through at least one of the turned-on first transistors.

6. The structure of an output stage as claimed in claim 1, wherein each of the first auxiliary electrodes is electrically connected to the two adjacent second auxiliary electrodes through at least one of the turned-on first transistors.

7. The structure of an output stage as claimed in claim 1, wherein each of the second auxiliary electrodes is electrically connected to the two adjacent first auxiliary electrodes through at least one of the turned-on first transistors.

8. The structure of an output stage as claimed in claim 1, wherein each of the third auxiliary electrodes is electrically connected to one of the two adjacent fourth auxiliary electrodes through at least one of the turned-on second transistors.

9. The structure of an output stage as claimed in claim 1, wherein each of the third auxiliary electrodes is electrically connected to the two adjacent fourth auxiliary electrodes through at least one of the turned-on second transistors.

10. The structure of an output stage as claimed in claim 1, wherein each of the fourth auxiliary electrodes is electrically connected to the two adjacent third auxiliary electrodes through at least one of the turned-on second transistors.

11. The structure of an output stage as claimed in claim 1, wherein the first transistors are respectively a PMOS-type transistor and the second transistors are respectively an NMOS-type transistor.

* * * * *